(12) United States Patent
Lee et al.

(10) Patent No.: US 6,828,190 B2
(45) Date of Patent: Dec. 7, 2004

(54) METHOD FOR MANUFACTURING CAPACITOR OF SEMICONDUCTOR DEVICE HAVING DIELECTRIC LAYER OF HIGH DIELECTRIC CONSTANT

(75) Inventors: Byoung-taek Lee, Seoul (KR); Ki-hoon Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/276,803

(22) Filed: Mar. 26, 1999

(65) Prior Publication Data

US 2002/0177273 A1 Nov. 28, 2002

(30) Foreign Application Priority Data

Mar. 26, 1998 (KR) .............................. 98-10584

(51) Int. Cl.[7] .......................................... H01L 21/8242
(52) U.S. Cl. ..................................................... 438/240
(58) Field of Search ................................ 438/240, 210, 438/393; 257/310

(56) References Cited

U.S. PATENT DOCUMENTS

| | | | |
|---|---|---|---|
| 5,439,845 A | * 8/1995 | Watanabe et al. | 437/130 |
| 5,561,307 A | * 10/1996 | Mihara et al. | 257/295 |
| 5,614,018 A | 3/1997 | Azuma et al. | 117/68 |
| 5,882,979 A | * 3/1999 | Ping et al. | 438/398 |
| 5,910,218 A | 6/1999 | Park et al. | 118/719 |
| 6,025,205 A | * 2/2000 | Park et al. | 438/3 |
| 6,162,744 A | * 12/2000 | Al-Shareef et al. | 438/785 |

FOREIGN PATENT DOCUMENTS

| | | | | |
|---|---|---|---|---|
| JP | 9153491 | 6/1997 | | |
| WO | WO 96/02067 | 1/1996 | | |
| WO | WO-96/02067 | * 1/1996 | ....... | H01L/21/3205 |

OTHER PUBLICATIONS

Wolf, S., Tauber, R. N.; Silicon Processing for the VLSI Era; Lattice Press, Sunset Beach, Ca.; 1986; pp. 57,183,388–389.*

Wolf, S.; Tauber, R. N.; Silicon Processing For the VLSI Era: vol. 1; Lattice Press; Sunset Beach, Ca.; 1986; pp. 57.*

Korean Patent Publication No. 99–165484 (Published on Jun. 26, 1997, Extracted Translation).

* cited by examiner

Primary Examiner—W. David Coleman
(74) Attorney, Agent, or Firm—Volentine Francos, PLLC (57) ABSTRACT

A method of manufacturing a capacitor includes sequentially forming a storage electrode, a high dielectric layer, a plate electrode, and an interdielectric layer over a semiconductor substrate. A first post-annealing of the substrate is performed under an inert atmosphere at a first temperature, and then a second post-annealing is performed at a second temperature. The first and second post annealings can be performed after forming the high dielectric layer, the plate electrode, or the interdielectric layer, or any combination thereof, as long as the second post-annealing is performed after the first post-annealing. The post-annealings are not necessarily performed in a same place or stage. The first temperature may be about 600° C. to 900° C., and the second temperature about 100° C. to 600° C. As a result, the dielectric constant of the high dielectric layer is increased, and leakage current is reduced.

17 Claims, 8 Drawing Sheets

METHOD FOR MANUFACTURING CAPACITOR OF SEMICONDUCTOR DEVICE HAVING DIELECTRIC LAYER OF HIGH DIELECTRIC CONSTANT

This application relies for priority upon Korean Patent Application No. 98-10584, filed on Mar. 26, 1998, the contents of which are herein incorporated by reference in their entirety.

BACKGROUND OF THE INVENTION

The present invention relates to a method for manufacturing a capacitor. More particularly, the present invention relates to a method for manufacturing a capacitor having a dielectric layer with a high dielectric constant, i.e., having a high dielectric layer.

As the integration of a dynamic random access memory (DRAM) semiconductor device increases, the area that may used for a capacitor is reduced within a defined cell area. This reduction in available capacitor area makes it difficult to obtain the capacitance required for the operation of a semiconductor device using conventional dielectric layers such as an oxide layer and a nitride layer.

In order to increase capacitance, several methods have been proposed for forming a storage electrode of a capacitor using a three-dimensional structure. However, even when a three-dimensional storage electrode is used, it is still difficult to obtain the capacitances required for a highly integrated semiconductor devices using conventional dielectric layer materials.

To solve the above problems, a method has been proposed that uses a high dielectric layer, e.g., a (Ba,Sr)TiO$_3$ or 'BST' layer, for the capacitor of the semiconductor device. However, if a high dielectric layer is employed for the capacitor, a noble metal electrode must be used as the plate and storage electrodes in order to obtain a high capacitance by suppressing the reaction of the high dielectric layer with the plate and storage nodes during subsequent processes. Furthermore, the noble metal electrode has strong reaction with silicon, so a barrier layer must be formed between the noble metal electrode and the high dielectric layer. However, when this is done, the barrier layer may be oxidized during a subsequent process, which can short an electrode or increase the leakage current.

SUMMARY OF THE INVENTION

To solve the above problems, it is an objective of the present invention to provide a method for manufacturing a capacitor in a semiconductor device in which a barrier layer is prevented from being oxidized and the leakage current is reduced when a high dielectric layer is employed for the capacitor.

In order to achieve these objectives, a method is provided for manufacturing a capacitor of a semiconductor device, comprising: forming a storage electrode over a semiconductor substrate, forming a high dielectric layer over the storage electrode, forming a plate electrode over the high dielectric layer, performing a first post-annealing of the semiconductor substrate under an inert atmosphere at a first temperature, and performing a second post-annealing of the semiconductor substrate, after the first post-annealing, at a second temperature lower than the first temperature.

This method may further comprise forming an interdielectric layer over the plate electrode, or performing a third post-annealing, after the second post-annealing, at a third temperature lower than the second temperature.

The first and second post-annealings may be performed in sequence after forming a high dielectric layer, after forming a plate electrode, or after forming an interdielectric layer. The first and second post-annealings may also be separated, for example, the first post-annealing step being performed after forming the high dielectric layer, and the second post-annealing step being performed after forming the plate electrode.

There is also provided a method of manufacturing a capacitor of a semiconductor device in which a storage electrode, a high dielectric layer, a plate electrode and an interdielectric layer are in sequence formed on a semiconductor substrate, includes the steps of performing a first post-annealing of the semiconductor substrate under an inert atmosphere at a first temperature, e.g., about 600° C. to 900° C., after forming the high dielectric layer, the plate electrode or the interdielectric layer; and then performing a second post-annealing of the semiconductor substrate post-annealed at a second temperature lower than the first temperature, e.g., about 100° C. to 600° C.

Also, a method for manufacturing a capacitor of a semiconductor device, in which a storage electrode, a high dielectric layer, a plate electrode and an interdielectric layer are in sequence formed on a semiconductor substrate, includes the steps of: post-annealing the semiconductor substrate where the high dielectric layer is formed, under an inert atmosphere at a first temperature, e.g., 600~900° C.; and then post-annealing the semiconductor substrate post-annealed at a second temperature lower than the first temperature, e.g., 100~600° C., after forming the plate electrode.

The high dielectric layer may be formed of a dielectric material having a Perovskite such as (Sr, Ti)O$_3$, (Ba, Sr)TiO$_3$, Pb(Zr, Ti)O$_3$, or (Pb, La)(ZrTi)O$_3$. The plate electrode and the storage electrode may be formed of Pt, Ru, Ir, IrO$_2$, RuO$_2$, a conductive material having a Perovskite structure such as SrRuO$_3$, CaSrRuO$_3$, BaSrRuO$_3$, an alloy containing Pt, an alloy containing Ru, or an alloy containing Ir. The post-annealing at the first and second temperatures may be performed separately or in the same location. Also, the post-annealing at the first and second temperatures may be performed in a furnace or a rapid vacuum thermal annealing apparatus.

According to a method for manufacturing a capacitor of a semiconductor device of the present invention, the first post-annealing is performed under an inert atmosphere at a high temperature after depositing a high dielectric layer, forming a plate electrode or an interdielectric layer, and then the second post-annealing is performed at a lower temperature, after the first post-annealing. The first and second post annealing steps can be performed after the deposition of the high dielectric layer, the plate electrode, or the interdielectric layer, or any combination of this, so long as the second post-annealing is performed after the first post-annealing. The two post-annealings do not have to be performed in the same place or at the same stage during the fabrication process. As a result of this process, the dielectric constant of the high dielectric layer is increased and the oxidation of a barrier layer is suppressed, which acts to reduce the leakage current.

BRIEF DESCRIPTION OF THE DRAWINGS

The above objective and advantages of the present invention will become more apparent by describing in detail a preferred embodiment of the present invention with reference to the attached drawings in which.

DESCRIPTION OF THE PREFERRED EMBODIMENTS

FIGS. 1 through 5 are sectional views illustrating a method for manufacturing a capacitor of a semiconductor device having a high dielectric layer according to a first preferred embodiment of the present invention. FIG. 6 is a flowchart illustrating a method for manufacturing a capacitor of a semiconductor device according to the first preferred embodiment of the present invention. While the process is described below with respect to FIGS. 1 to 5, the corresponding steps shown in FIG. 6 will be given in parenthesis, where appropriate.

Figure 1:
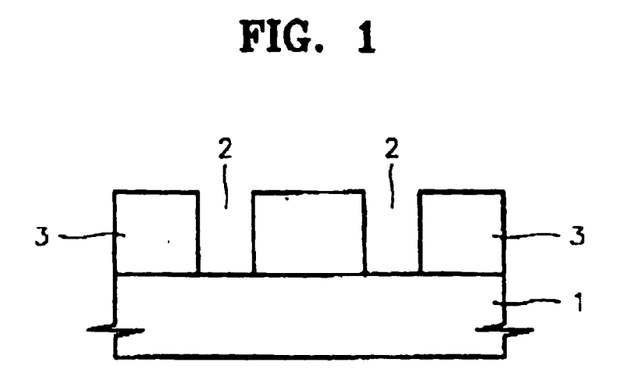
FIGS. 1 through 5 are sectional views illustrating a method for manufacturing a capacitor of a semiconductor device according to a first preferred embodiment of the present invention.

As shown in FIG. 1, a first interdielectric layer 3 having one or more contact holes 2 is formed over a semiconductor substrate 1, e.g., a silicon substrate, where a transistor (not shown) is formed (Step 100). The contact holes 2 are formed such that a predetermined portion of the semiconductor substrate 1, e.g., a source region of the transistor, is exposed. Although more than one contact hole may be formed, for ease of explanation, the following description will only describe a single contact hole. It should be understood, however, that the process would be similar for multiple contact holes.

Figure 2:
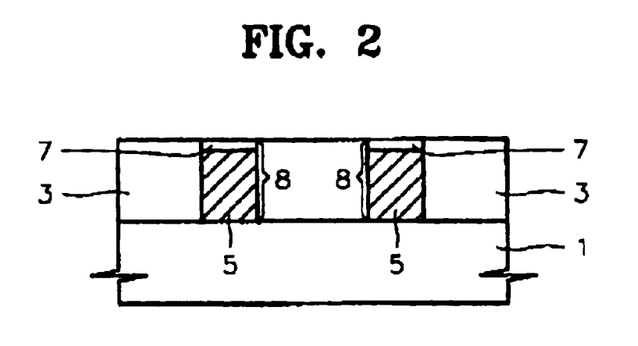

Referring to FIG. 2, a polysilicon layer doped with an impurity such as phosphorus is deposited over the entire surface of the semiconductor substrate 1 where the contact hole 2 is formed, filling the contact hole 2. The resultant structure is then chemically/mechanically polished to form a burial layer 5 in the contact hole 2. Then, a metal layer, e.g., titanium, is deposited over the entire surface of a substrate where the burial layer 5 and the first interdielectric layer 3 are formed, and the resultant structure, including the metal layer, is annealed and etched to selectively form a metal silicide 7 over the burial layer 5. By this process, a plug 8 is formed in the contact hole 2, the plug being made up of the burial layer 5 and the metal silicide 7 (Step 105).

Figure 3:
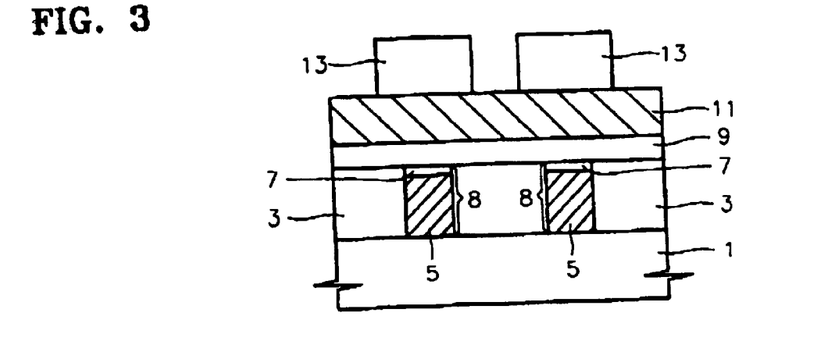

Referring to FIG. 3, a barrier layer 9 is formed over the entire surface of the semiconductor substrate 1 where the plug 8 is formed. The barrier layer 9 prevents the silicon of the plug from reacting with a first conductive layer 11, which is used to form a storage electrode. The barrier layer 9 is preferably formed of Ti, TiN, TiAlN, TiSiN, TaN, TaAlN, or TaSiN.

The first conductive layer 11, which will be used as a storage electrode of a capacitor in a semiconductor device, is then formed over the barrier layer 9 (Step 110). The first conductive layer 11 is preferably formed of Pt, Ru, Ir, $RuO_2$, $RuO_2$, a conductive material having a Perovskite structure such as $SrRuO_3$, $CaSrRuO_3$, $BaSrRuO_3$, an alloy containing Pt, an alloy containing Ru, or an alloy containing Ir. This is because the nonoxidative metal used for the first conductive layer is an inert material that prevents the first conductive layer 11 from being oxidized when a high dielectric layer is formed at a high temperature. A mask pattern 13 that is used as an oxide layer is then formed over the first conductive layer 11 for the storage electrode.

Figure 4:
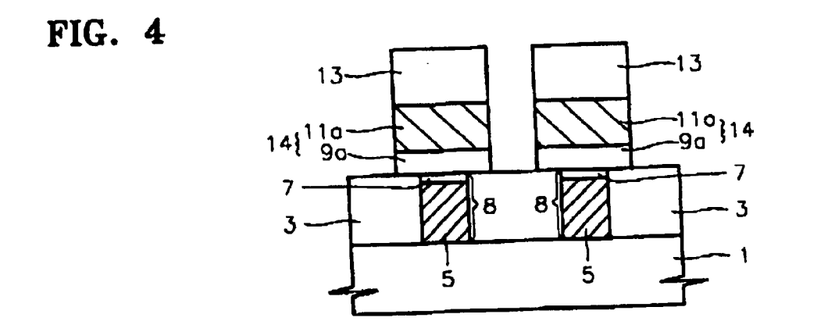

Referring to FIG. 4, the first conductive layer 11 and the barrier layer 9 are plasma-etched using the mask pattern 13 as a mask, thereby forming a barrier layer pattern 9a and a first conductive layer pattern 11a. The barrier layer pattern 9a and the first conductive layer pattern 11a become a storage electrode 14 of the capacitor (Step 115).

Figure 5:
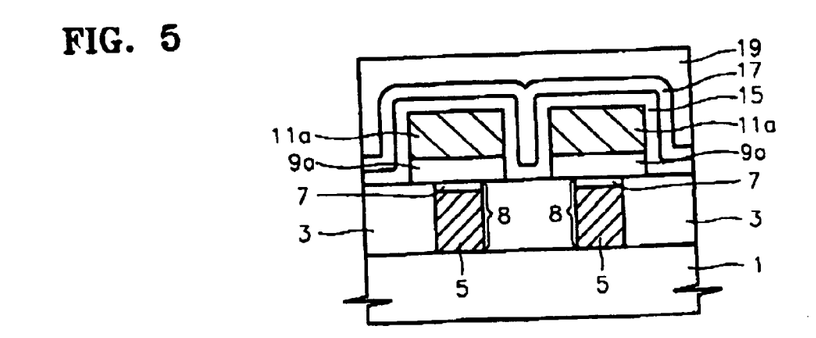
Figure 6:
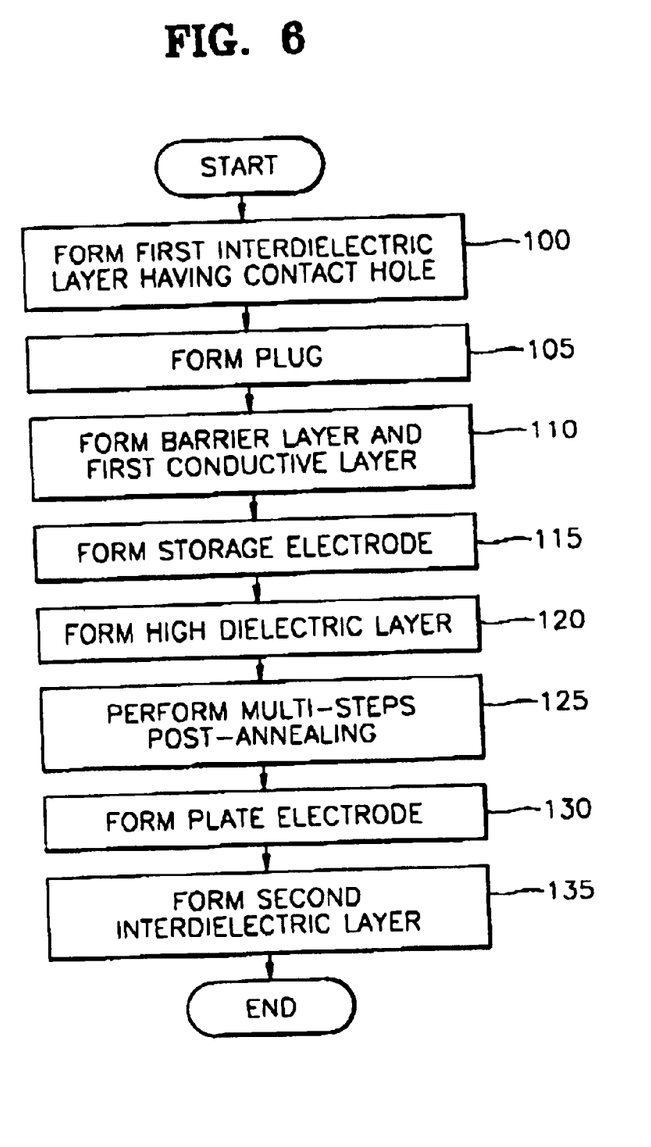
FIG. 6 is a flowchart illustrating a method for manufacturing a capacitor of a semiconductor device according to the first preferred embodiment of the present invention.

As shown in FIG. 5, the mask pattern 13 is removed and a high dielectric layer 15 is formed over the entire surface of the semiconductor substrate 1 where the storage electrode is formed. Preferably the high dielectric layer is formed by sputtering at about 400~510° C. to a height of about 400~500 Å (Step 120). The high dielectric layer 15 preferably comprises a dielectric material having a Perovskite structure, such as $(Sr, Ti)O_3$, $(Ba, Sr)TiO_3$, $Pb(Zr, Ti)O_3$ or $(Pb, La)(ZrTi)O_3$.

In order to obtain high capacitance and low leakage current from the manufactured capacitor, the semiconductor substrate over which the high dielectric layer 15 is formed is then post-annealed (Step 125). Preferably, the semiconductor substrate 1 over which the high dielectric layer 15 is formed is post annealed in multiple annealing steps. In the case where two annealing steps are used, the semiconductor substrate is initially post-annealed in a first post-annealing step at a first temperature, e.g., 600~900° C. This first post-annealing at the first temperature is preferably performed under an inert atmosphere, e.g., under a nitrogen atmosphere of 100 ppm of oxygen or less, in a furnace or a rapid vacuum thermal annealing apparatus. Then, the semiconductor substrate 1 is again post-annealed in a second post annealing step, preferably in an oxygen atmosphere at a second temperature lower than the first temperature, e.g., 100~600° C. This second post-annealing step is also preferably performed in a furnace or a rapid vacuum thermal annealing apparatus. The first and second post-annealing steps may be performed separately or in-situ.

In addition, although a two step post-annealing process is described by way of example, it should be understood that the post-annealing may also be performed in multiple steps at three or more temperatures. For example, in a three step post annealing process, the three temperatures used would be a first temperature, a second temperature lower than the first temperature, and a third temperature lower than the second temperature.

Referring again to FIG. 5, after the formation of the high dielectric layer 15, a second conductive layer 17, to be used for a plate electrode, is formed over the high dielectric layer 15, to complete a capacitor (Step 130). The second conductive layer 17 for the plate electrode is preferably formed of Pt, Ru, Ir, $IrO_2$, $RuO_2$, a conductive material having a Perovskite structure such as $SrRuO_3$, $CaSrRuO_3$, $BaSrRuO_3$, an alloy containing Pt, an alloy containing Ru, or an alloy containing Ir.

Subsequently, a second interdielectric layer 19 is formed over the entire surface of the semiconductor substrate 1 where the plate electrode 17 is formed (Step 135). Additional processes may then be performed in the same manner as with the manufacturing of conventional semiconductor devices.

Figure 7:
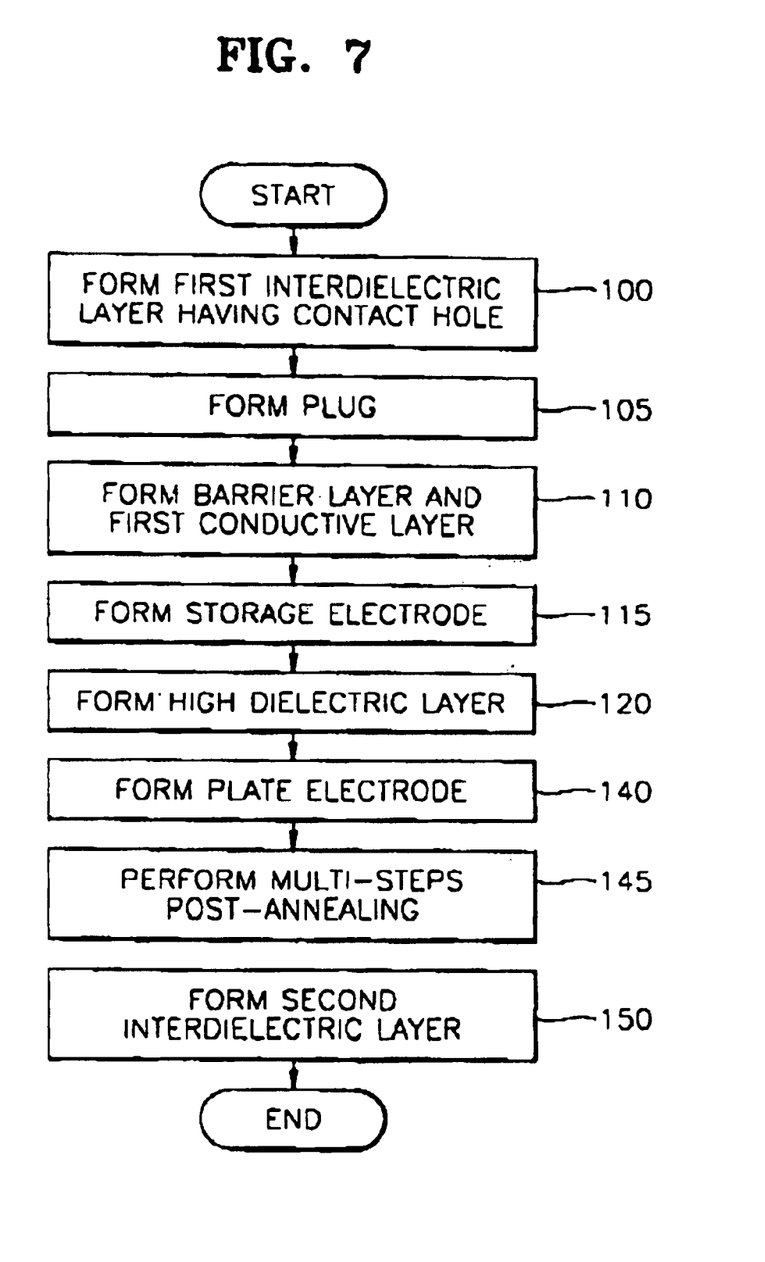
FIG. 7 is a flowchart illustrating a method for manufacturing a capacitor of a semiconductor device according to a second preferred embodiment of the present invention.

FIG. 7 is a flowchart illustrating a method for manufacturing a capacitor of a semiconductor device according to a second preferred embodiment of the present invention.

The same reference numerals as those of FIGS. 1 through 6 represent the same elements. The second embodiment of the present invention is the same as the first embodiment, except that, the multiple-steps post-annealing is performed after, rather than before, the step of forming the plate electrode. In detail, steps 100~120 shown in FIGS. 1 through 5 of the first embodiment are performed on the semiconductor substrate 1 to form the same storage electrode and high dielectric layer 15 as in the first embodiment. As in the first preferred embodiment, the high dielectric layer 15 is preferably formed of a dielectric material having a Perovskite structure such as $(Sr, Ti)O_3$, $(Ba, Sr)TiO_3$, $Pb(Zr, Ti)O_3$ or $(Pb, La)(ZrTi)O_3$.

A plate electrode 17 is then formed in the same manner as described in Step 130 of the first embodiment, over the high dielectric layer 15 (Step 140). As in the first preferred embodiment, the plate electrode 17 is preferably formed of Pt, Ru, Ir, $IrO_2$, $RuO_2$, a conductive material having a Perovskite structure such as $SrRuO_3$, $CaSrRuO_3$, $BaSrRuO_3$, an alloy containing Pt, an alloy containing Ru, or an alloy containing Ir.

In order to obtain a high capacitance and a low leakage current from the capacitor, the semiconductor substrate 1 over which the plate electrode 17 is formed is post-annealed in multiple steps (Step 145). In the second preferred embodiment, a two-step post-annealing process is used.

In detail, the semiconductor substrate 1 is initially post-annealed in a first post-annealing step at a first temperature, e.g., 600~900° C. The first post-annealing step is preferably performed under an inert atmosphere, e.g., a nitrogen atmosphere having fewer than 100 ppm of oxygen, in a furnace or a rapid vacuum thermal annealing apparatus. Then, the semiconductor substrate 1 is again post-annealed in a second post-annealing step at a second temperature lower than the first temperature, e.g., 100~600° C. The second post-annealing step is preferably performed in a furnace or a rapid vacuum thermal annealing apparatus. The first and second post-annealing steps may performed separately or in-situ.

In addition, although a two step post-annealing process is described by way of example, it should be understood that the post-annealing may also be performed in multiple steps at three or more temperatures, as long as the temperatures gradually decrease. For example, in a three step post annealing process, the three temperatures used would be a first temperature, a second temperature lower than the first temperature, and a third temperature lower than the second temperature.

Subsequently, a second interdielectric layer 19 is formed over the entire surface of the semiconductor substrate where the storage electrode 14, the high dielectric layer 15 and the plate electrode 17 are formed (Step 150). Additional processes may then be performed in the same manner as in a typical method for manufacturing a semiconductor device.

Figure 8:
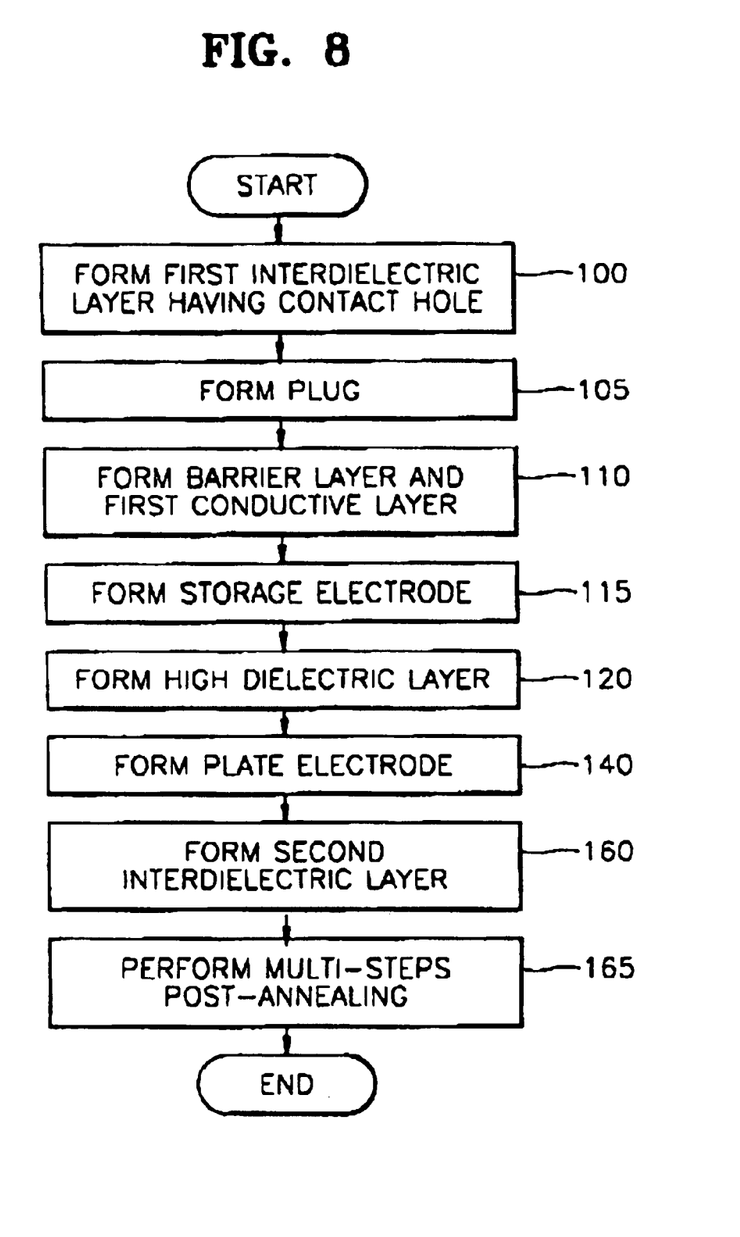
FIG. 8 is a flowchart illustrating a method for manufacturing a capacitor of a semiconductor device according to a third preferred embodiment of the present invention.

FIG. 8 is a flowchart illustrating a method for manufacturing a capacitor of a semiconductor device according to a third preferred embodiment of the present invention. The same reference numerals as those of FIGS. 1 through 6 represent the same elements. The third preferred embodiment of the present invention is the same as the second preferred embodiment, except that the multiple annealing steps are performed after step of forming a second interdielectric layer.

In detail, the storage electrode, high dielectric layer 15, and plate electrode 140 are formed over the semiconductor substrate 1 in the same manner as described with reference to steps 100 through 140 of FIGS. 1 through 5 and FIG. 7 of the second preferred embodiment. The high dielectric layer 15 is preferably formed of a dielectric material having a Perovskite structure, such as $(Sr, Ti)O_3$, $(Ba, Sr)TiO_3$, $Pb(Zr, Ti)O_3$, or $(Pb, La)(ZrTi)O_3$, and the plate electrode 17 is preferably formed of Pt, Ru, Ir, $IrO_2$, $RuO_2$, a conductive material having a Perovskite structure such as $SrRuO_3$, $CaSrRuO_3$, $BaSrRuO_3$, an alloy containing Pt, an alloy containing Ru, or an alloy containing Ir.

Subsequently, a second interdielectric layer 19 is formed over the entire surface of the semiconductor substrate over which the plate electrode 17 is formed (Step 160).

In order to obtain high capacitance and low leakage current of the capacitor, the semiconductor substrate 1 over which the second interdielectric layer 19 is formed is then post-annealed in a multiple-step post-annealing process (Step 165). In the third preferred embodiment, a two-step post-annealing process is used.

In detail, the semiconductor substrate 1 over which the second interdielectric layer 19 is formed is initially post-annealed in a first post-annealing step at a first temperature, e.g., 600~900° C. The first post-annealing step is preferably performed under an inert atmosphere, e.g., a nitrogen atmosphere having 100 ppm of oxygen or less, in a furnace or a rapid vacuum thermal annealing apparatus. Then, the primary post-annealed semiconductor substrate is again post-annealed in a second post annealing step at a second temperature lower than the first temperature, e.g., 100~600° C. The second post-annealing step is preferably performed under an atmosphere of oxygen in a furnace or a rapid vacuum thermal annealing apparatus. The first and second post-annealing steps may be performed separately or in-situ.

In addition, although a two step post-annealing process is described by way of example, it should be understood that the post-annealing may also be performed in multiple steps at three or more temperatures, as long as the temperatures gradually decrease. For example, in a three step post annealing process, the three temperatures used would be a first temperature, a second temperature lower than the first temperature, and a third temperature lower than the second temperature.

Figure 9:
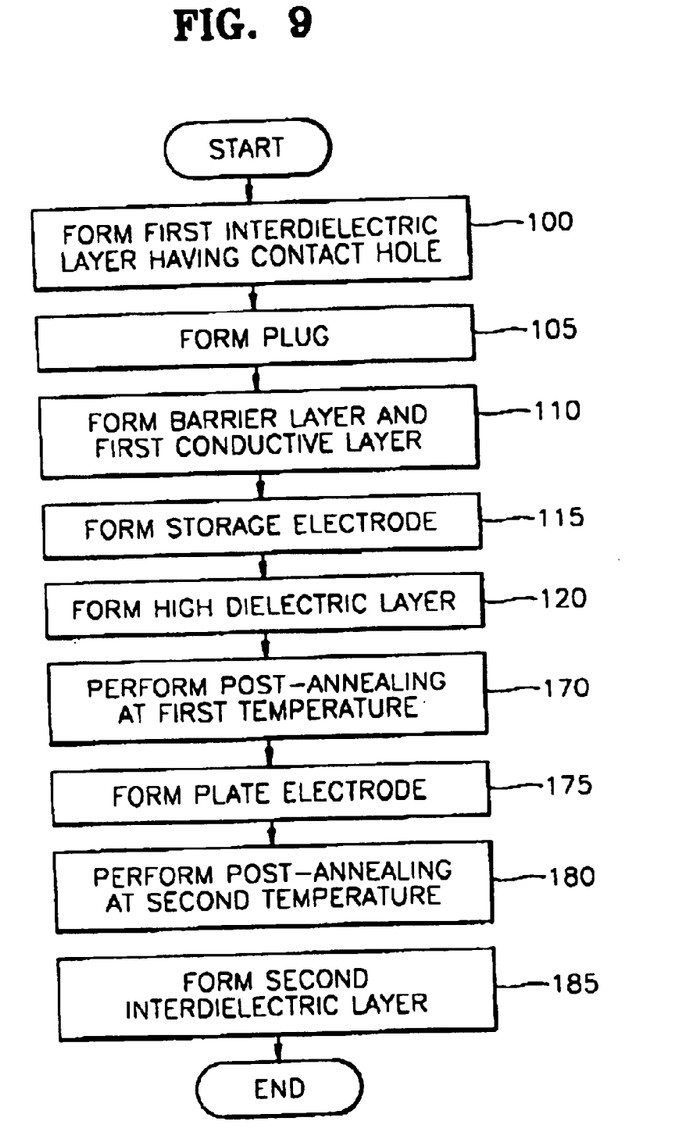
FIG. 9 is a flowchart illustrating a method for manufacturing a capacitor of a semiconductor device according to a fourth preferred embodiment of the present invention.

FIG. 9 is a flowchart illustrating a method for manufacturing a capacitor of a semiconductor device according to a fourth preferred embodiment of the present invention. The same reference numerals as those of FIGS. 1 through 6 of the first embodiment represent the same elements. The fourth preferred embodiment of the present invention is the same as the first preferred embodiment, except that a first post-annealing step is performed at a first temperature after the step of forming a high dielectric layer, and then a second post-annealing step is performed at a second temperature after the step of forming a plate electrode.

In detail, a storage electrode 14 and a high dielectric layer 15 are formed over a semiconductor substrate in the same manner as in steps 100 through 120 of FIGS. 1 through 4 of the first preferred embodiment (Step 120). Then, the semiconductor substrate 1, where the high dielectric layer 15 is formed, is initially post-annealed in a first post-annealing step at a first temperature, e.g., 600~900° C. (step 170). The first post-annealing step is preferably performed under an inert atmosphere, e.g., a nitrogen atmosphere having 100 ppm of oxygen or less, preferably in a furnace or a rapid vacuum annealing apparatus.

A plate electrode 17 is then formed over the high dielectric layer 15 in the same manner as described in Step 130 of the first embodiment (Step 175). The high dielectric layer 15 is preferably formed of Pt, Ru, Ir, $IrO_2$, $RuO_2$, a conductive material having a Perovskite structure such as $SrRuO_3$, $CaSrRuO_3$, $BaSrRuO_3$, an alloy containing Pt, an alloy containing Ru, or an alloy containing Ir.

After the plate electrode 17 is formed, the semiconductor substrate 1 is again post-annealed in a second post-annealing step, preferably under an oxygen atmosphere at a second temperature lower than the first temperature, e.g., 100~600° C. (step 180). The post-annealing at the second temperature is preferably performed in a furnace or a rapid vacuum annealing apparatus.

In addition, although a split two step post-annealing process is described by way of example, it should be understood that the post-annealing may also be performed in multiple steps at three or more temperatures, as long as the temperatures gradually decrease. For example, in a three step post annealing process, the three temperatures used would be a first temperature, a second temperature lower than the first temperature, and a third temperature lower than the second temperature. In this embodiment, the various post-annealing steps would be split up sequentially such that one or more took place after the step of forming a high dielectric layer (Step 120) and one or more took place after the step of forming a plate electrode (Step 175).

Subsequently, a second interdielectric layer 19 is formed over the entire surface of the semiconductor substrate 1 where the plate electrode 17 is formed (Step 185). Additional processes may then be performed in the same manner as in a typical method for manufacturing a semiconductor device.

In order to manufacture a capacitor of a semiconductor device according to the first preferred embodiment of the present invention, capacitance and leakage current are described as follows.

Figure 10:
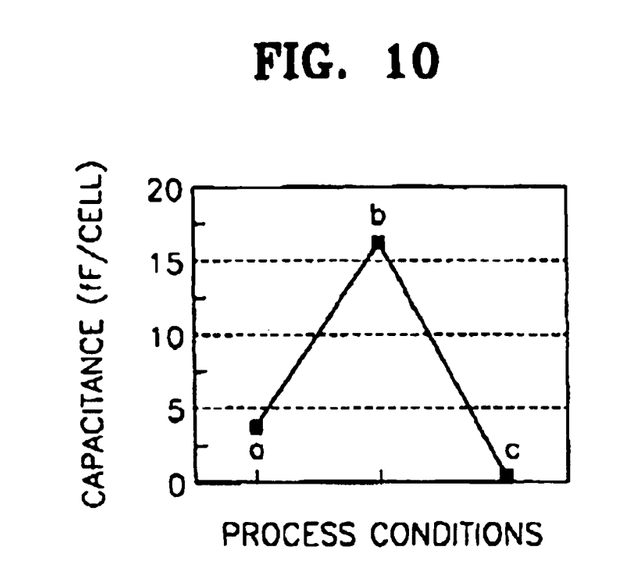
FIG. 10 is a graph illustrating the capacitance of a capacitor of a semiconductor device formed by a conventional post-annealing method.

FIG. 10 is a graph illustrating the capacitance of a capacitor of a semiconductor device formed according to a related annealing method.

In detail, FIG. 10 shows the capacitance per cell of a capacitor having a high dielectric BST layer deposited at 400° C. to a thickness of 400 Å. Reference character a represents the capacitance after forming a plate electrode; reference character b represents the capacitance after post-annealing in a furnace of 550° C. under an oxygen atmosphere; and reference character c represents the capacitance after post-annealing in a furnace of 650° C. under an oxygen atmosphere.

In detail, the capacitance a of the capacitor after forming the plate electrode is approximately 5 fF/cell, and the capacitance b after post-annealing under the oxygen atmosphere is increased to 16.5 fF/cell. However, the capacitance c after post-annealing under the oxygen atmosphere of 650° C. is 1 fF/cell or less due to the oxidation of the barrier layer, so that advantageous properties of the high dielectric layer capacitor are not realized.

As shown by this example, post-annealing at a temperature in which the barrier layer is not oxidized increases the capacitance to a predetermined degree, but post annealing at a temperature at which the barrier layer is oxidized, reduces the capacitance due to the oxidation of the barrier layer. Thus, in order to use the high dielectric layer for the capacitor, it is necessary to anneal at a high temperature while suppressing oxidation of the barrier layer.

Figure 11:
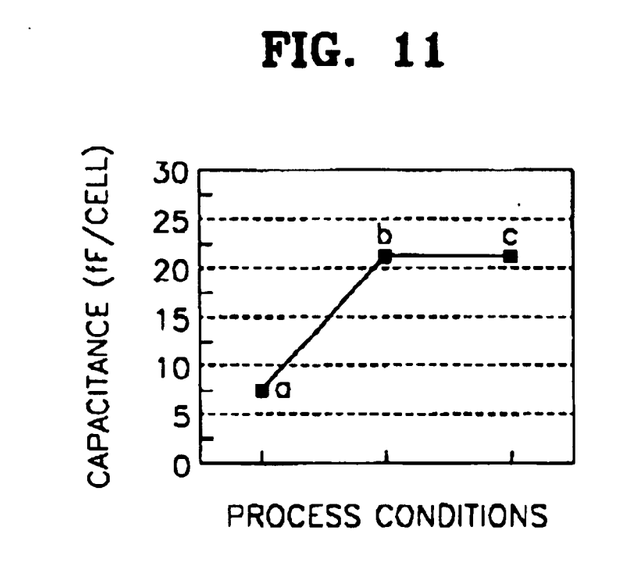
FIG. 11 is a graph illustrating the capacitance of a capacitor of a semiconductor device formed by a post-annealing method according to preferred embodiments of the present invention.

FIG. 11 is a graph illustrating the capacitance of a capacitor of a semiconductor device using a post-annealing process in accordance with preferred embodiments of the present invention.

In detail, FIG. 11 shows the capacitance per cell of a capacitor having a high dielectric BST layer deposited at 450° C. to a thickness of 400 Å. Here, reference character a represents the capacitance after forming the plate electrode; reference character b represents the capacitance after a post-annealing in a furnace of 700° C. under a nitrogen atmosphere having 100 ppm of oxygen of or less; and reference character c represents the capacitance after a first post-annealing step in a furnace of 700° C. under a nitrogen atmosphere, and then a second post-annealing step in a furnace of 400° C. containing oxygen.

In detail, the deposition temperature of the BST layer of FIG. 11 is higher than that of the capacitor of FIG. 10, so that the capacitance a after forming the plate electrode is higher than that of FIG. 10, at 7.5 fF/cell. Also, the capacitance b of the capacitor after the first post-annealing step under the nitrogen atmosphere including little or no oxygen has a value of 21 fF/cell. As described above, in order to obtain the high capacitance during a process in which the BST layer is used in the capacitor, the post-annealing must be performed under an atmosphere in which the barrier layer is not oxidized.

Figure 12:
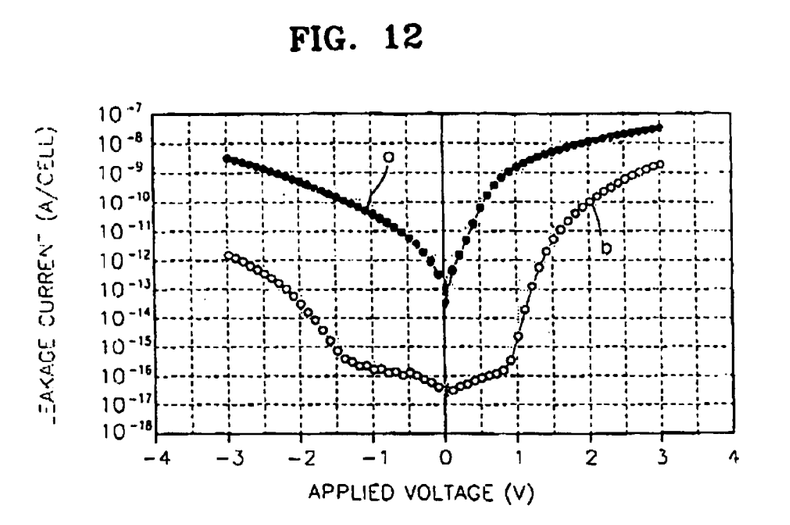
FIG. 12 is a graph illustrating leakage current characteristics of a capacitor of a semiconductor device formed by a post-annealing method according to preferred embodiments of the present invention.

However, if the capacitor is post-annealed at a high temperature as with reference character b, the capacitance is increased, but the leakage current is increased as shown in FIG. 12, resulting in an unreliable capacitance. The increase in the leakage current is caused by stress mismatching due to a stress change between the BST layer and the plate and storage electrodes during the annealing at a high temperature.

In order to solve the stress mismatching, a multiple-step annealing process, i.e., a first annealing step at a high temperature under a nitrogen atmosphere and then a second annealing step at a low temperature, was performed. In other words, as represented by reference character c, a first post-annealing step was performed under a nitrogen atmosphere at 700° C., and then a second post-annealing step was performed under an oxygen atmosphere at 400° C. The capacitance c of the capacitor after the multiple-step annealing process is 21 fF/cell, similar to the capacitance b. From this result, the capacitance of a capacitor fabricated by a multiple step annealing process does not change significantly. Also, after the multiple annealing steps, the leakage current was reduced by an order of 5~6 on the basis of 1V as shown in FIG. 12.

FIG. 12 is a graph illustrating the leakage current of a capacitor of a semiconductor device according to the post-annealing steps of preferred embodiments of the present invention.

In detail, FIG. 12 shows the leakage current of the capacitor after post-annealing of the manufactured capacitor.

In particular, reference character a represents the capacitance after post-annealing at 700° C., and reference character b represents the capacitance after a multiple-step post-annealing, including a first post-annealing step in a furnace at 700° C. under a nitrogen atmosphere and then a second post-annealing step in a furnace containing oxygen at 400° C. The leakage current after post-annealing, as shown by plot b, is reduced by 5~6 orders of magnitude on the basis of 1V, compared with the capacitance a after a single post-annealing step under a nitrogen atmosphere at a high temperature.

Figure 13:
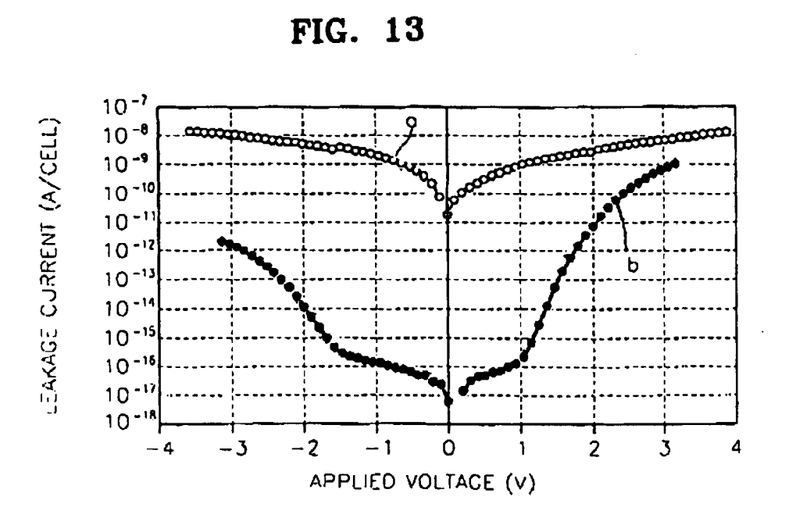
FIG. 13 is a graph illustrating leakage current characteristics of a capacitor of a semiconductor device formed according to preferred embodiments of the present invention.

FIG. 13 is a graph illustrating the leakage current of a capacitor of a semiconductor device according to preferred embodiments of the present invention.

In detail, FIG. 13 shows the leakage current of the capacitor after forming a second interdielectric layer and then post-annealing. Reference character a represents the capacitance of a capacitor post-annealed under a nitrogen atmosphere at 650° C., and reference character b represents the capacitance of a capacitor post-annealed in a multiple post annealing process, including a first post-annealing step in a furnace under a nitrogen atmosphere at 650° C. and a second post annealing step in a furnace containing oxygen at 400° C.

In detail, in plot b of the capacitor is post-annealed in a multiple-step post-annealing process after depositing the second interdielectric layer. In this case, the leakage current is reduced compared with the plot a of a capacitor post-annealed in a single step under a nitrogen atmosphere.

According to the method for manufacturing a capacitor of a semiconductor device of the present invention, a multiple step post-annealing process is performed in which a first post-annealing step is performed under an inert atmosphere at a high temperature after depositing a high dielectric layer, forming a plate electrode or an interdielectric layer, and second post-annealing step is performed at a low temperature; or a first post-annealing step is performed under an inert gas at a high temperature after depositing the high dielectric layer and a second post-annealing step is performed after forming the plate electrode, so that the dielectric constant of the high dielectric layer is increased and the oxidation of a barrier layer is suppressed, to reduce leakage current.

It should be understood that the invention is not limited to the illustrated embodiments and that many changes and modifications can be made within the scope of the invention by a person skilled in the art.

What is claimed is:

1. A method for manufacturing a capacitor of a semiconductor device, comprising:
   forming a storage electrode over a semiconductor substrate;
   forming a high dielectric layer over the storage electrode;
   forming a plate electrode directly on the high dielectric layer;
   performing a first post-annealing of the semiconductor substrate under an inert atmosphere at a first temperature; and
   performing a second post-annealing of the semiconductor substrate, after the first post-annealing, at a second temperature lower than the first temperature in an oxygen environment,
   the first and second post-annealings being performed in-situ,
   wherein the plate electrode is formed of one selected from the group consisting of Pt, Ru, Ir, $IrO_2$, $RuO_2$, $SrRuO_3$, $CaSrRuO_3$, $BaSrRuO_3$, an alloy containing Pt, an alloy containing Ru, and an alloy containing Ir.

2. A method for manufacturing a capacitor of a semiconductor device, as recited in claim 1, wherein the high dielectric layer comprises a material selected from the group consisting of $(Sr, Ti)O_3$, $(Ba, Sr)TiO_3$, $Pb(Zr, Ti)O_3$, and $(Pb, La)(ZrTi)O_3$.

3. A method for manufacturing a capacitor of a semiconductor device, as recited in claim 1, wherein the first temperature is between 600° C. and 900° C.

4. A method for manufacturing a capacitor of a semiconductor device, as recited in claim 1, wherein the second temperature is between 100° C. and 600° C.

5. A method for manufacturing a capacitor of a semiconductor device, as recited in claim 1, wherein the first and second post-annealing steps are performed in a furnace or a rapid vacuum thermal annealing apparatus.

6. A method for manufacturing a capacitor of a semiconductor device, as recited in claim 1, wherein the first and second post-annealing steps are performed after the step of forming the high dielectric layer.

7. A method for manufacturing a capacitor of a semiconductor device, comprising:
   forming a storage electrode over a semiconductor substrate;
   forming a high dielectric layer over the storage electrode;
   forming a plate electrode directly on the high dielectric layer;
   performing a first post-annealing of the semiconductor substrate under an inert atmosphere at a first temperature; and
   performing a second post-annealing of the semiconductor substrate, after the first post-annealing, at a second temperature lower than the first temperature in an oxygen environment,
   the first and second post-annealings being performed after the forming of the plate electrode,
   wherein the plate electrode is formed of one selected from the group consisting of Pt, Ru, Ir, $IrO_2$, $RuO_2$, $SrRuO_3$, $CaSrRuO_3$, $BaSrRuO_3$, an alloy containing Pt, an alloy containing Ru, and an alloy containing Ir.

8. A method for manufacturing a capacitor of a semiconductor device, as recited in claim 1, wherein the first post-annealing step is performed after the step of forming the high dielectric layer and the second post-annealing step is performed after the step of forming the plate electrode.

9. A method for manufacturing a capacitor of a semiconductor device, as recited in claim 1, further comprising forming an interdielectric layer over the plate electrode.

10. A method for manufacturing a capacitor of a semiconductor device, comprising:
    forming a storage electrode over a semiconductor substrate;
    forming a high dielectric layer over the storage electrode;
    forming a plate electrode directly on the high dielectric layer;
    performing a first post-annealing of the semiconductor substrate under an inert atmosphere at a first temperature;
    performing a second post-annealing of the semiconductor substrate, after the first post-annealing, at a second temperature lower than the first temperature in an oxygen environment; and
    forming an interdielectric layer over the plate electrode,
    the first and second post-annealings being performed after the forming of the interdielectric layer, wherein the plate electrode is formed of one selected from the group consisting of Pt, Ru, Ir, $IrO_2$, $RuO_2$, $SrRuO_3$, $CaSrRuO_3$, $BaSrRuO_3$, an alloy containing Pt, an alloy containing Ru, and an alloy containing Ir.

11. A method for manufacturing a capacitor of a semiconductor device, as re in claim 9, wherein the first post-annealing step is performed after the step of forming the high dielectric layer and the second post-annealing step is performed after the step of forming the plate electrode.

12. A method for manufacturing a capacitor of a semiconductor device, as recited in claim 1, further comprising performing a third post-annealing, after the second post-annealing, at a third temperature lower than the second temperature.

13. A method for manufacturing a capacitor of a semiconductor device in which: a storage electrode; a high dielectric layer; a plate electrode formed directly on the high dielectric layer and comprising one selected from the group consisting of Pt, Ru, Ir, $IrO_2$, $RuO_2$, $SrRuO_3$, $CaSrRuO_3$, $BaSrRuO_3$, an alloy containing Pt, an alloy containing Ru, and an alloy containing Ir; and an interdielectric layer are sequentially formed on a semiconductor substrate, further comprising:

performing a first post-annealing of the semiconductor substrate under an inert atmosphere at a first temperature; and performing a second post-annealing of the semiconductor substrate, after the first post-annealing, at a second temperature lower than the first temperature in an oxygen environment, the first and second post-annealings being performed after forming of the plate electrode.

14. A method for manufacturing a capacitor or a semiconductor device, as recited in claim 13, wherein the high dielectric layer comprises a material selected from the group consisting of $(Sr, Ti)O_3$, $(Ba, Sr)TiO_3$, $Pb(Zr, Ti)O_3$, and $(Pb, La)(ZrTi)O_3$.

15. A method for manufacturing a capacitor or a semiconductor device, as recited in claim 13, wherein the first temperature is between 600° C, and 900° C.

16. A method for manufacturing a capacitor or a semiconductor device, as recited in claim 13, wherein the second temperature is between 100° C, and 600° C.

17. A method for manufacturing a capacitor or a semiconductor device, as recited in claim 13, further comprising performing a third post-annealing, after the second post-annealing, at a third temperature lower than the second temperature.

* * * * *